(12) United States Patent
Chung et al.

(10) Patent No.: US 10,838,012 B2
(45) Date of Patent: Nov. 17, 2020

(54) METHOD OF DIAGNOSING AN ELECTRICAL ENERGY STORAGE APPARATUS, AN ELECTRONIC DEVICE FOR USE IN AN ELECTRICAL ENERGY STORAGE APPARATUS AND AN ELECTRICAL ENERGY STORAGE APPARATUS

(71) Applicant: City University Hong Kong, Kowloon (HK)

(72) Inventors: Shu Hung Henry Chung, Mid-Levels (HK); Chun For Liu, Tuen Mun (HK); Wing Hong Lau, New Territories (HK)

(73) Assignee: City University of Hong Kong, Kowloon (HK)

( * ) Notice: Subject to any disclaimer, the term of this patent is extended or adjusted under 35 U.S.C. 154(b) by 323 days.

(21) Appl. No.: 15/927,272

(22) Filed: Mar. 21, 2018

(65) Prior Publication Data

US 2018/0275200 A1 Sep. 27, 2018

Related U.S. Application Data

(60) Provisional application No. 62/475,350, filed on Mar. 23, 2017.

(51) Int. Cl.
G01R 31/3828 (2019.01)
H01M 10/48 (2006.01)
G01R 31/385 (2019.01)
H01M 10/04 (2006.01)

(52) U.S. Cl.
CPC ....... G01R 31/3828 (2019.01); G01R 31/386 (2019.01); H01M 10/48 (2013.01); H01M 10/482 (2013.01); H01M 10/0445 (2013.01)

(58) Field of Classification Search
None
See application file for complete search history.

(56) References Cited

U.S. PATENT DOCUMENTS

2012/0326654 A1* 12/2012 Ito .................... B60L 53/53
320/103
2016/0363634 A1* 12/2016 Cheng ............... G01R 31/3648

OTHER PUBLICATIONS

Chung et al. "Control Parameter Optimization for a Microgrid System Using Particle Swarm Optimization," 2008 IEEE ICSET p. 837-842. (Year: 2008).*
Liu CT, et al.; Diagnostic Cell for Large-Scale Battery Banks; Applied Power Electronics Conference and Exposition (APEC) 2017 IEEE.

* cited by examiner

*Primary Examiner* — Roy Y Yi
(74) *Attorney, Agent, or Firm* — Renner Kenner Greive Bobak Taylor & Weber

(57) ABSTRACT

A method of diagnosing an electrical energy storage apparatus includes exciting at least one energy storage system in the electrical energy storage apparatus; sampling data associated with an electrical characteristic of the at least one energy storage system in response to the excitation of the at least one energy storage system; and estimating at least one electrical parameter and/or at least one operational condition attribute of the at least one energy storage system.

14 Claims, 12 Drawing Sheets

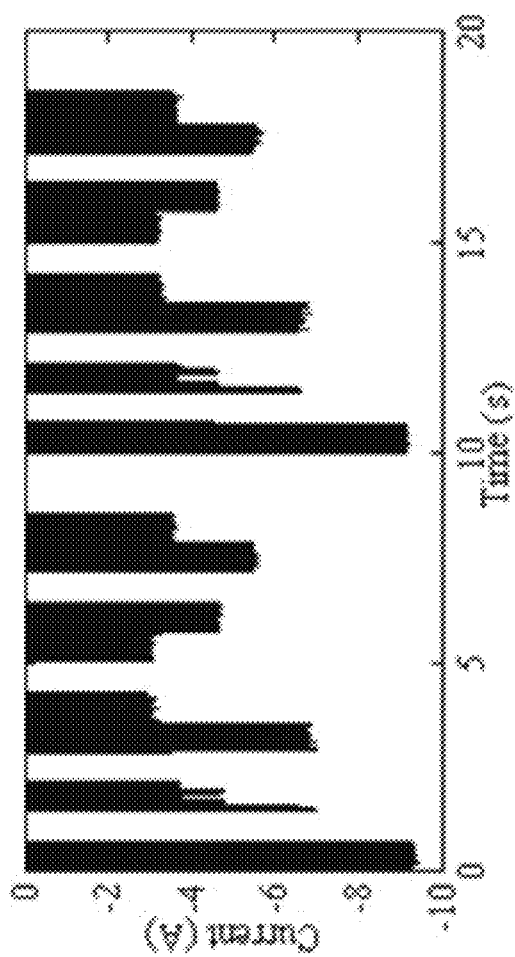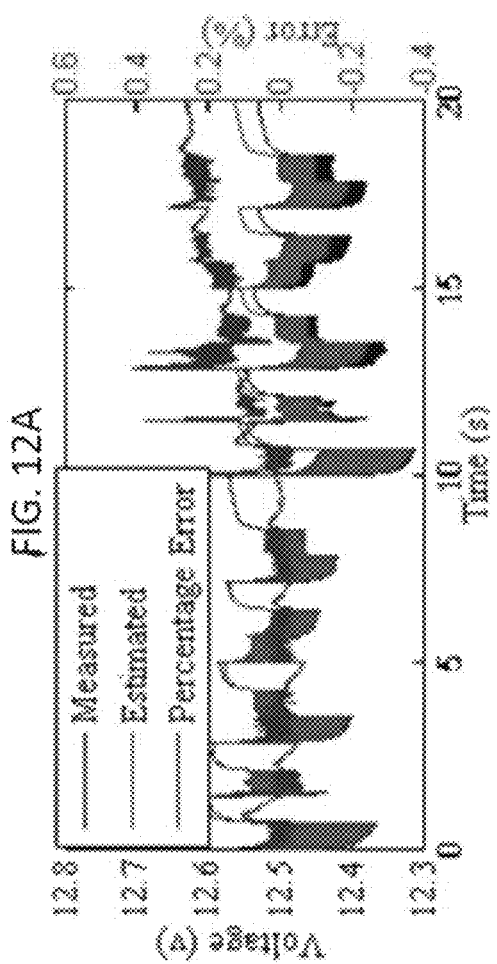
FIG. 12A
FIG. 12B

METHOD OF DIAGNOSING AN ELECTRICAL ENERGY STORAGE APPARATUS, AN ELECTRONIC DEVICE FOR USE IN AN ELECTRICAL ENERGY STORAGE APPARATUS AND AN ELECTRICAL ENERGY STORAGE APPARATUS

TECHNICAL FIELD

The present invention relates to a method of diagnosing an electrical energy storage apparatus, an electronic device for use in an electrical energy storage apparatus and an electrical energy storage apparatus, and particularly, although not exclusively, to a diagnostic cell for providing real-time monitoring a condition of a battery system.

BACKGROUND

Secondary energy storage device such as battery systems or assemblies may be used in various applications such as electric vehicles, portable electronic devices, power tools or temporary energy sources.

These energy storage devices may be composed of a plurality of interconnected battery cells according to different requirements such as capacities and voltages. The health or condition of the battery cells may deteriorate after a certain number of charging and recharging cycles, and may affect the normal operations or performances of the connected appliances.

SUMMARY OF THE INVENTION

In accordance with a first aspect of the present invention, there is provided a method of diagnosing an electrical energy storage apparatus, comprising the steps of: exciting at least one energy storage system in the electrical energy storage apparatus; sampling data associated with an electrical characteristic of the at least one energy storage system in response to the excitation of the at least one energy storage system; and estimating at least one electrical parameter and/or at least one operational condition attribute of the at least one energy storage system.

In an embodiment of the first aspect, the at least one energy storage system comprises a first energy storage component and a second energy storage component.

In an embodiment of the first aspect, the first energy storage component and the second energy storage component are connected in series.

In an embodiment of the first aspect, the step of exciting at least one energy storage system includes facilitating transferring energy stored in the first energy storage component to the second energy storage component.

In an embodiment of the first aspect, the step of exciting at least one energy storage system further includes facilitating transferring energy stored in the second energy storage component to the first energy storage component.

In an embodiment of the first aspect, the step of exciting at least one energy storage system further includes facilitating recycling transferred energy from the second energy storage component to the first energy storage component.

In an embodiment of the first aspect, the step of exciting at least one energy storage system includes manipulating individual switches in a switching-network to facilitate the energy transfer between the first energy storage component and the second energy storage component.

In an embodiment of the first aspect, the electrical characteristic includes at least a current profile and a voltage profile associated with the at least one energy storage system under the excitation.

In an embodiment of the first aspect, the electrical characteristic includes a plurality of intrinsic parameters of the first energy storage component and/or the second energy storage component.

In an embodiment of the first aspect, the electrical parameter includes an internal resistance of the first energy storage component and/or the second energy storage component.

In an embodiment of the first aspect, the electrical parameter further includes a state of charge and/or a state of health of the first energy storage component and/or the second energy storage component.

In an embodiment of the first aspect, the step of estimating the at least one electrical parameter of the at least one energy storage system includes processing the sampled data with a particle swarm optimization process.

In an embodiment of the first aspect, the step of estimating the at least one electrical parameter is based on an equivalent model of the at least one energy storage system, wherein the equivalent model is composed of a voltage source, an output resistor and at least one resistor-capacitor network.

In an embodiment of the first aspect, the state of charge of the first energy storage component or the second energy storage component may be found by the relationship of state of charge and open circuit voltage of the first energy storage component or the second energy storage component respectively.

In an embodiment of the first aspect, the state of health of the first energy storage component and/or the second energy storage component is indicated by the output resistor of the equivalent circuit model.

In an embodiment of the first aspect, the step of processing the sampled data with the particle swarm optimization process involve a perturbation process.

In accordance with a second aspect of the present invention, there is provided an electronic device for use in an electrical energy storage apparatus, comprising a controller and a switching network controlled by the controller so as to excite an energy storage system in the electrical energy storage apparatus; wherein the controller is further arranged to sample data associated with an electrical characteristic of the energy storage system in response to the excitation of the energy storage system, and to estimate at least one electrical parameter and/or at least one operational condition attribute of the energy storage system.

In an embodiment of the second aspect, the energy storage system comprises a first energy storage component and a second energy storage component.

In an embodiment of the second aspect, the first energy storage component and the second energy storage component are connected in series.

In an embodiment of the second aspect, the energy storage system further comprises a voltage conditioning circuit and a current conditioning circuit.

In an embodiment of the second aspect, the switching network is electrically connected to a plurality of output terminals of the first energy storage component and the second energy storage component.

In an embodiment of the second aspect, the combination of the controller, the switching network, the voltage conditioning circuit and the current conditioning circuit defines a bidirectional busk boost converter.

In an embodiment of the second aspect, the energy storage system includes at least two battery cells.

In an embodiment of the second aspect, the electrical energy storage apparatus includes a battery assembly.

In an embodiment of the second aspect, the electrical energy storage apparatus includes an uninterruptible power supply system.

In an embodiment of the second aspect, the at least one operational condition attribute includes a state of charge and/or a state of health of the first energy storage component and/or the second energy storage component.

In accordance with a third aspect of the present invention, there is provided an electrical energy storage apparatus, comprising a plurality of energy storage systems each includes a pair of energy storage components and an electronic device in accordance the second aspect; wherein the pair of energy storage components are connected in series, and is further connected to a respective electronic device of each of the plurality of energy storage systems.

BRIEF DESCRIPTION OF THE DRAWINGS

Embodiments of the present invention will now be described, by way of example, with reference to the accompanying drawings in which:

FIGS. 12A and 12B are plots showing a current profile, a voltage profile and a prediction error of the measurement results of battery 2.

DETAILED DESCRIPTION OF THE PREFERRED EMBODIMENT

Figure 1:
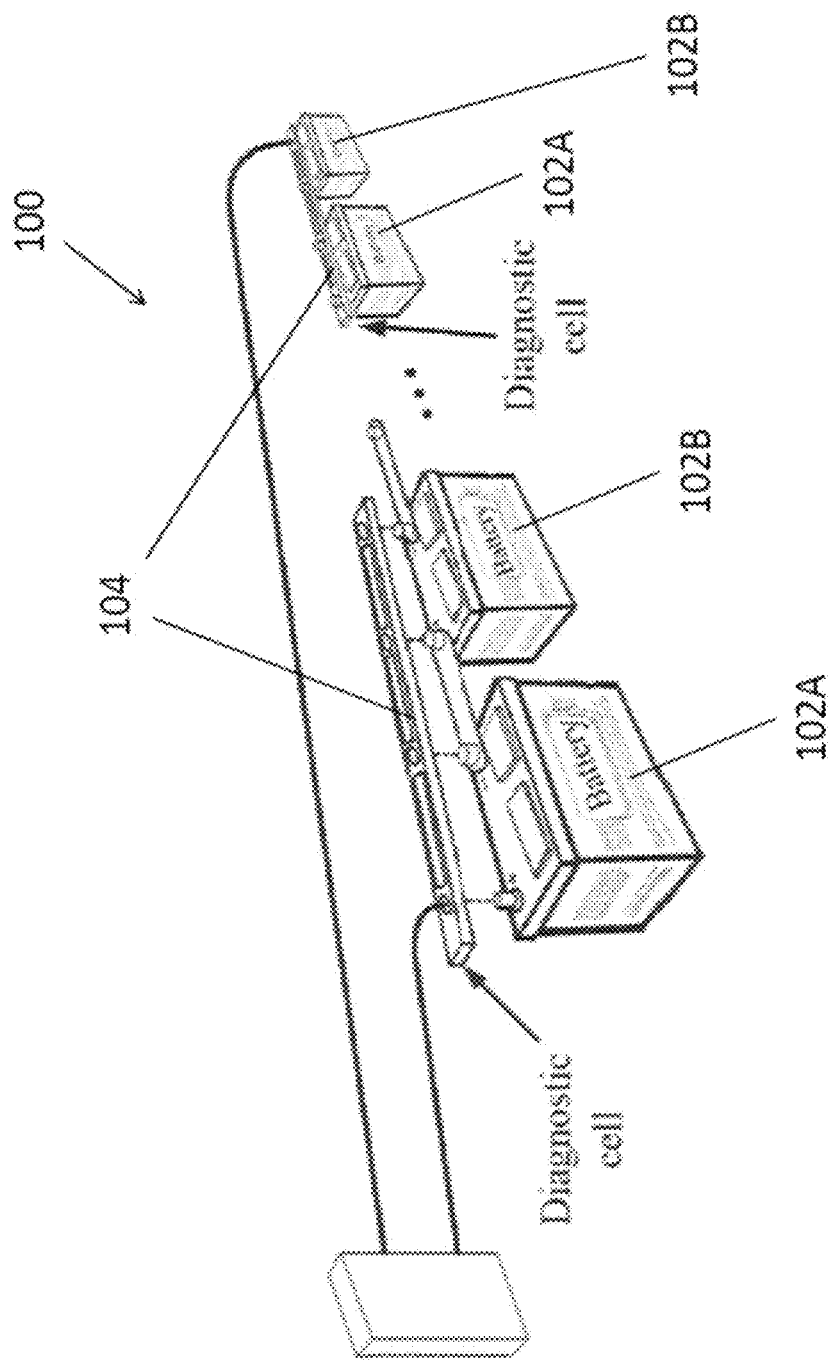
FIG. 1 is a perspective view of an electrical energy storage apparatus in accordance with one embodiment of the present invention wherein the diagnostic electronic devices are connected to the battery cells in the electrical energy storage apparatus.

The inventors have, through their own research, trials and experiments, devised that, battery banks in many battery storage systems, such as uninterruptible power supply (UPS) systems, may be placed in unattended or remote locations. Operators have to conduct regular on-site visual inspection of the service condition of the batteries. Unexpected premature battery failure cannot be discovered easily and accurately.

To ensure serviceability, those batteries are typically replaced after a few years of service, depending on the site condition and the maintenance practice and experience of the operators.

In an example embodiment of the present invention, there is provided a diagnostic cell for conducting real-time estimation of the State of Charge (SOC) and State of Health (SOH) of two series connected batteries, forming a basic unit for diagnosing the health of a large-scale battery bank.

Advantageously, operators may monitor the SOC and SOH remotely, and conduct replacement exercise at optimal time before any failure or incident occurs. The cell could save resources on regular site inspection. As the batteries are to be replaced near the end of their life cycle, it will also reduce undesired electronic waste.

The inventors devise that storage devices may provide power balance between the network's load and power generated, and they can support a more reliable power supply, for example, the use of uninterruptible power supply (UPS) to sustain the load operation upon power outage. Thus, energy storage and power electronics hold substantial promise for transforming the electric power industry.

Among various energy storage devices, batteries may have the highest energy density after the different fuels, such as petrol and hydrogen. It is thus crucial to understand the battery condition in order to provide operators with performance prediction, and maximize battery life with a sophisticated battery management system.

Without wishing to be bounded by theories, since battery voltage, battery current, and temperature are the only available measurable variables, it is sometimes necessary to rely on using an electrical battery model to estimate the intrinsic condition and predict the battery performance.

In one example, the internal resistance of the battery can be used as an indicator to quantify the SOH of the battery. When the SOH of a battery deteriorates, its internal resistance will increase. The SOH can be determined by comparing the internal resistance measured with the value of a new battery. When the internal resistance of a battery is increased to a threshold value, the battery should be replaced by a new one. The internal resistance can be recorded regularly in a long term. By analyzing the trend of the internal resistance, the life of the battery can be predicted.

Although some parameters in a battery model can be obtained from battery manufacturers, some parameters are time-varying and have to be determined experimentally. The first example estimation approach is based on testing the battery behaviour under a controlled testing environment to correlate some parameters with the battery condition. Some predefined load variations are applied to the battery under test to study the transient voltage response, from which the time constants of the transient RC networks in the intrinsic models of batteries are extracted. However, this approach may be less suitable for online estimation of battery parameters because a controlled environment is required.

The second example estimation approach is based on processing the data measured from the system during the online operation to estimate the parameters. For example, Unscented Kalman filter may be used to estimate the model parameters. However, it may take a long data points (thousands of seconds) to converge. In another example, a sequential quadratic programming technique may be used to extract the parameters, but it requires processing 300 minutes of long data sequence. For time-critical systems, such as UPS, this approach has a high potential to devise a platform that can provide real-time monitoring of the battery condition.

Moreover, it may be preferable to meet the following criteria: (1) having a battery model with high precision and moderate circuit complexity; (2) requiring a few samples for parameter estimation; and (3) using a simple parameter estimation method for time-efficient computation.

In a preferable embodiment of the present invention, there is provided a diagnostic cell which may be used to achieve the above criteria for large-scale battery bank. In this embodiment, each cell can diagnose two battery units at one time through the energy flow between the two connected battery units. Thus, the required number of cells is reduced and no extra energy storage element such as electrolytic capacitors are needed.

Preferably, a computational intelligence method may be utilized to perform real-time parameter estimation of an electrical model. The model characterizes the battery by using a dynamic capacitor and a resistor-capacitor network. The values of all intrinsic parameters are estimated by processing the sampled battery voltage and battery current with a modified particle swarm optimization (m-PSO) method, which is simple in operation, has low susceptibility to trapping to local optima, and allows parallel processing. Based on the estimated parameters, the state-of-charge (SOC) and state-of-health (SOH) will be determined.

With reference to FIG. 1, there is provided an embodiment of an electrical energy storage apparatus 100, comprising a plurality of energy storage systems each includes a pair of energy storage components 102 and an electronic device 104; wherein the pair of energy storage components 102 are connected in series, and is further connected to a respective electronic device 104 of each of the plurality of energy storage systems.

Referring to FIG. 1, a large-scale battery bank 100 is composed of many series-connected batteries. For example, the UPS system for the data center can have two battery banks for ensuring service contingency and continuity. Each bank can have more than 300 battery units connected in series.

Preferably, the energy storage components, such as the battery units may be grouped as one or more pairs, and each pair of the battery units is provided with a diagnostic electronic device 104, therefore defining a plurality of energy storage systems each includes two battery units 102 and a diagnostic electronic device 104.

Preferably, all battery units are connected to at least one diagnostic electronic device 104 which allows every battery unit to be tested or diagnosed.

Figure 2:
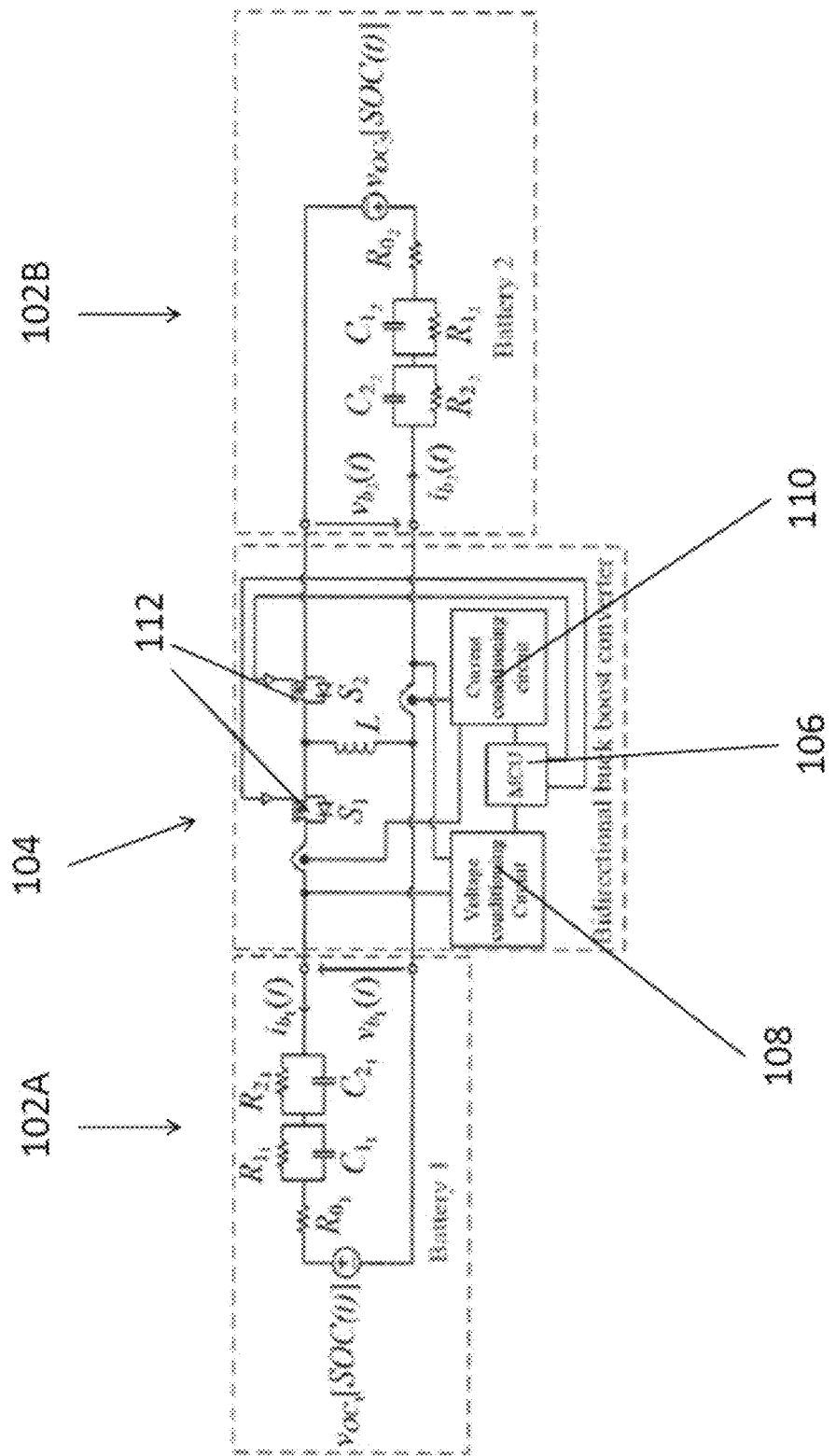
FIG. 2 is a schematic diagram of the electronic device in connection to two series-connected battery cells in the electrical energy storage apparatus of FIG. 1.

With reference to FIG. 2, the diagnostic cell 104 connecting two battery units for diagnosing the state of charge (SOC) and state of health (SOH) of a large-scale battery back 100 of FIG. 1 is discussed.

In this embodiment, the electronic devices 104 in the electrical energy storage apparatus 100 comprises a controller 106 and a switching network 112 controlled by the controller 106 so as to excite an energy storage system in the electrical energy storage apparatus 100; wherein the controller 106 is further arranged to sample data associated with an electrical characteristic of the energy storage system in response to the excitation of the energy storage system, and to estimate at least one electrical parameter and/or at least one operational condition attribute of the energy storage system.

Referring to FIG. 2, the energy storage system comprises a pair of battery units 102, including a first energy storage component 102A and a second energy storage component 102B being connected in series, and the diagnostic electronic device 104 is connected to terminals of the first and the second energy storage components 102.

Preferably, the device 104 consists of a bi-directional buck-boost converter, voltage and current conditioning circuits, and a microcontroller. The device is connected to two series-connected batteries, such as a first energy storage component 102A and a second energy storage component 102B, so that energy is transferred from one battery cell to another battery cell bi-directionally. By controlling the duty cycle of the switches $S_1$ and $S_2$, the converter 104 generates necessary current excitation to both batteries 102, which may be used to facilitate the transferring of energy stored in the first energy storage component 102A to the second energy storage component 120B, or vice versa.

In addition, the diagnostic device 104 comprises a voltage as well as a current conditioning/monitoring circuits (108, 110), which may be used in sampling the voltage/current values for evaluation of the associated battery units. In one example embodiment, the combination of the controller 106, the switching network 112, the voltage conditioning circuit 108 and the current conditioning circuit 110 defines the bidirectional buck boost converter.

By analyzing the electrical characteristic including current and voltage profiles of the charging and the discharging of the batteries 102, electrical parameters such as internal resistance of the batteries 102 may be extracted or estimated, and therefore, other related operational condition attributes such as a state of charge and or a state of health of the batteries 102 may be derived based on these electrical parameters by processing the measured data.

Figure 3:
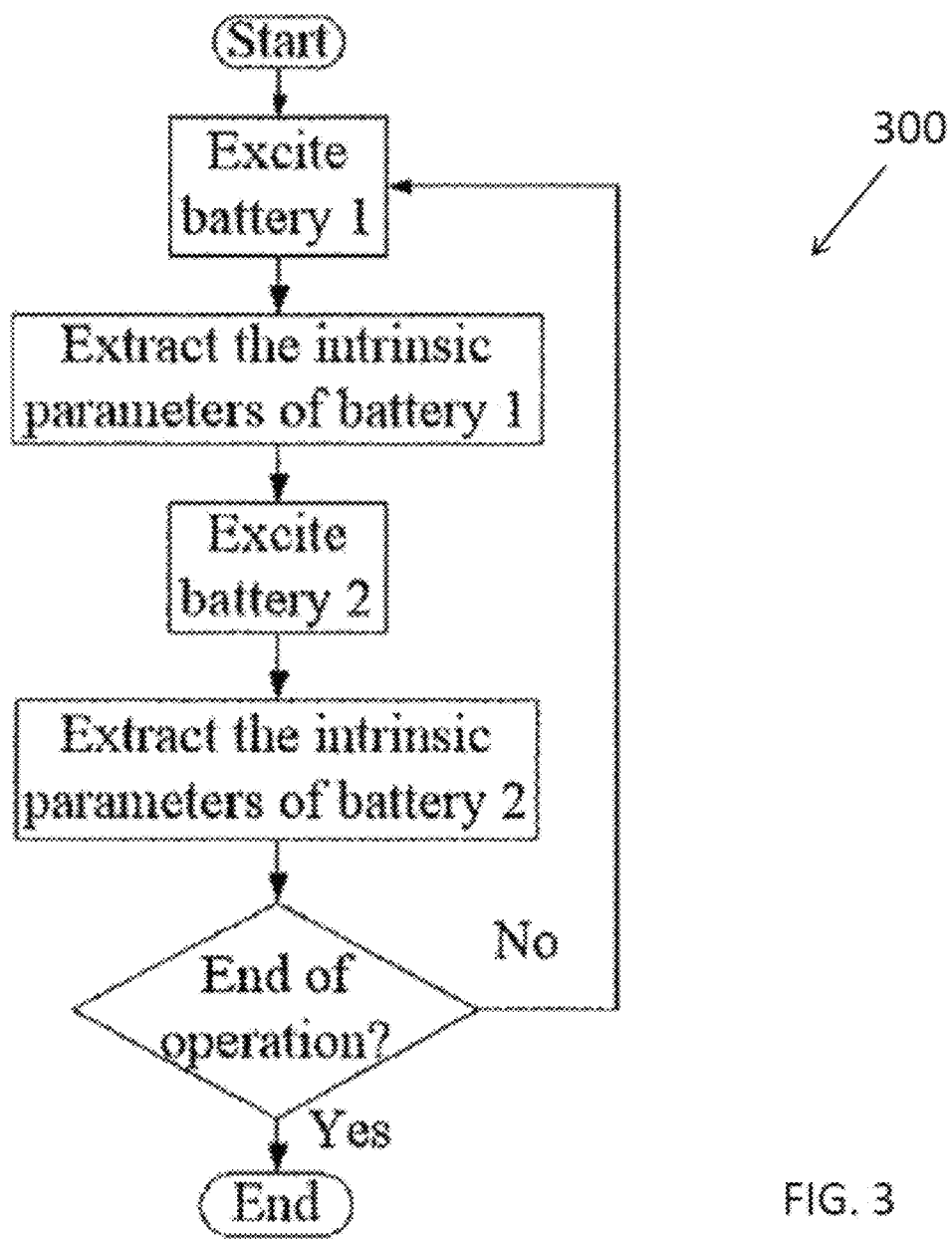
FIG. 3 is a flow diagram of the method of diagnosing an electrical energy storage apparatus in accordance with one embodiment of the present invention.

With reference to FIG. 3, there is shown an example operation 300 of diagnosing an electrical energy storage apparatus, comprising the steps of exciting at least one energy storage system 102 in the electrical energy storage apparatus 100; sampling data associated with an electrical characteristic of the at least one energy storage system 102 in response to the excitation of the at least one energy storage system 102; and estimating at least one electrical parameter and/or at least one operational condition attribute of the at least one energy storage system 102.

Figure 4:
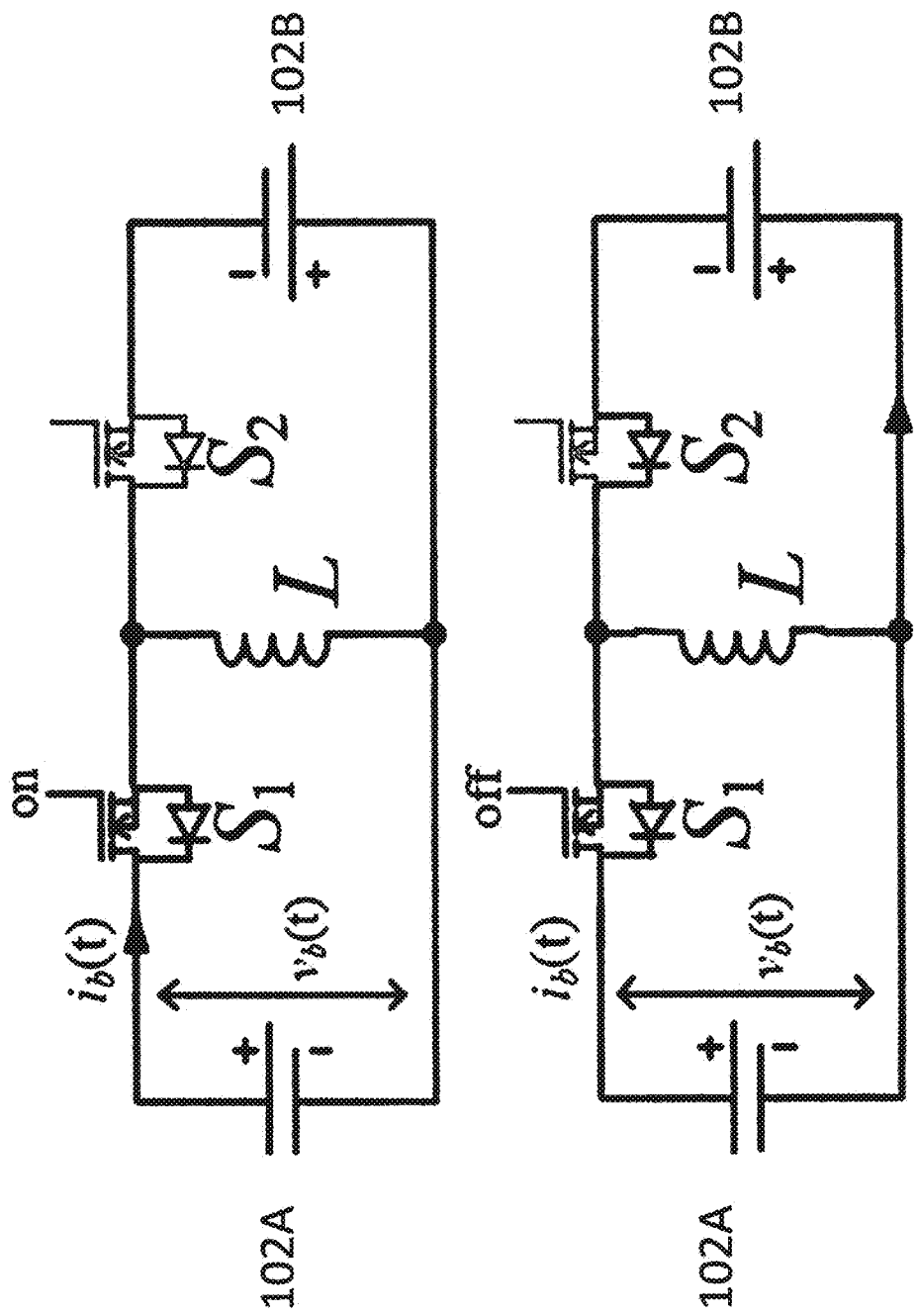
FIG. 4 is an illustration of the operation of the switches in the switching network of the electronic device of FIG. 2 in the step of exciting battery 1 of the two series-connected battery cells.

In this example embodiment, the operation of the diagnostic device 300 consists of two stages may be further described as follows:

Referring to FIG. 4, in Stage 1, the diagnostic cell 104 generates current excitation to battery 102A, $S_1$ is active and $S_2$ is off. Battery 102A is discharged and battery 102B is charged. The energy stored in battery 102A is transferred to battery 102B. The voltage and current of battery 102A is sampled and the data is used to estimate the intrinsic parameters using the m-PSO method.

Figure 5:
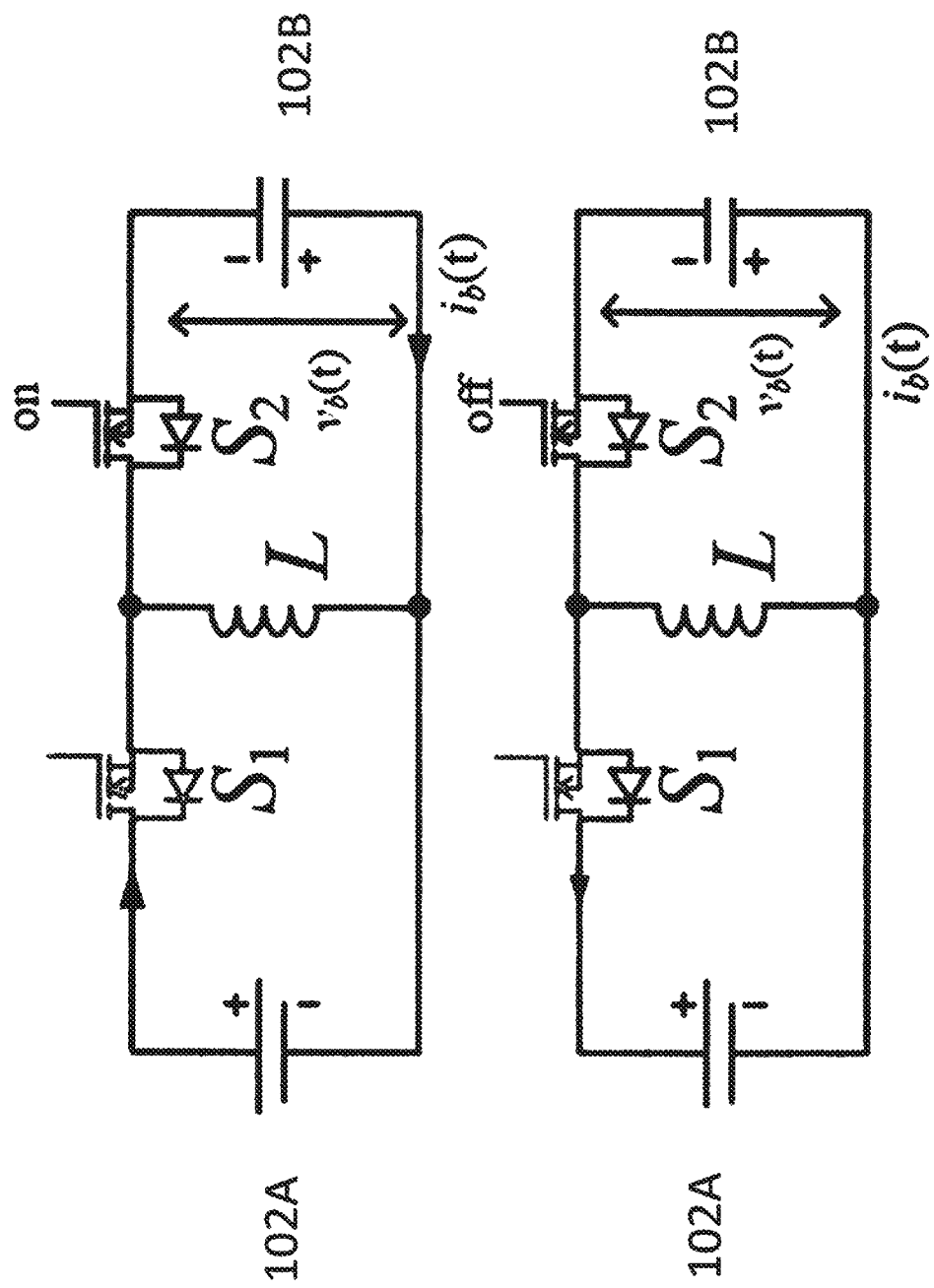
FIG. 5 is an illustration of the operation of the switches in the switching network of the electronic device of FIG. 2 in the step of exciting battery 2 of the two series-connected battery cells.

Referring to FIG. 5, in Stage 2, battery 102B is excited and $S_2$ is active and $S_1$ is off when the energy stored in battery 102B is recycled back to battery 102A. The voltage and current are sensed and the intrinsic parameters of battery 102B are extracted. Then Stage 1 is repeated to diagnose battery 102A.

Preferably, the converter may operate in discontinuous current mode, and $I_b$ is controlled by the duty cycle of PWM signal of $S_1$ and $S_2$. The average discharge current $I_b$ is derived as follows:

Suppose the switch $S_1$ is initially off, $$i_b(0) = 0 \tag{1}$$

When the switch is on, $$v_b(t) = L\frac{di_b(t)}{dt} \tag{2}$$

where L is the value of the inductor.

Integrating (2) with respect to time t, $$I_{b\text{-}pk} = \frac{V_b}{L}t_{on} \tag{3}$$

where $t_{on}$ is the on time of $S_1$, $I_{b\text{-}pk}$ is the peak discharge current, and $V_b$ is the average battery voltage. The average battery discharge current $I_b$ is expressed as:

$$I_b = \frac{I_{b\text{-}pk}D}{2} \tag{4}$$

where D is the duty cycle of $S_1$. By substituting (3) into (4), $$I_b = \frac{D^2 V_b}{2Lf_s} \tag{5}$$

where $f_s$ is the switching frequency.

Figure 6A:
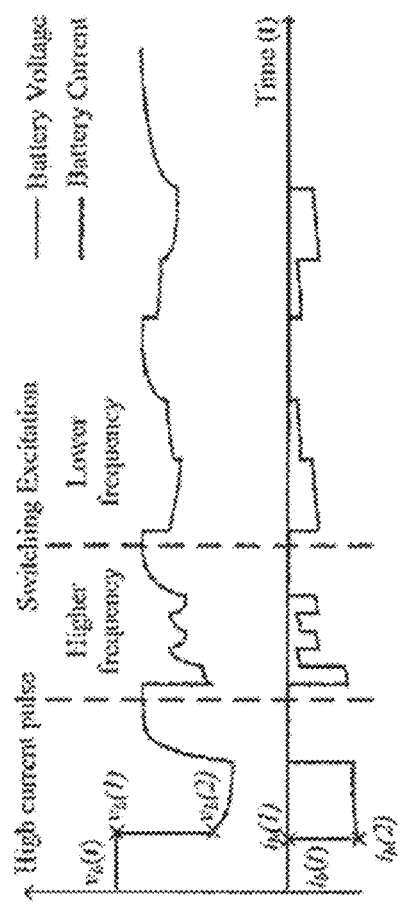
FIGS. 6A and 6B are plots showing the testing profile and the high current component in the testing profile.
Figure 6B:
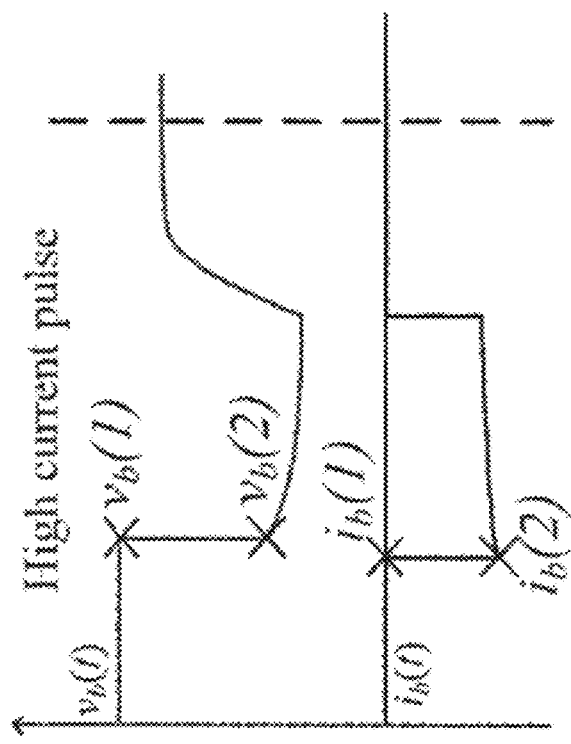

With reference to FIGS. 6A and 6B, there is shown a testing profile with the testing technique in accordance with an embodiment of the present invention. The profile consists of high- and low-frequency current excitations. The high current pulse helps extract the series output resistance $R_0$. The high- and low-frequency excitations aim to excite the short and long time constant $T_1$ and $T_2$ of the battery respectively.

Preferably, the step of estimating the electrical parameter may base on an equivalent model of the energy storage component or the battery unit, wherein the equivalent model is composed of a voltage source, an output resistor and at least one resistor-capacitor network.

The battery model shown in FIG. 2 is adopted. It is composed of a SOC-related voltage source, an output resistor, and two RC-networks. The SOC is defined as the ratio of the charge stored in the battery to the charge $Q_0$, stored in a fully-charged battery.

Figure 7:
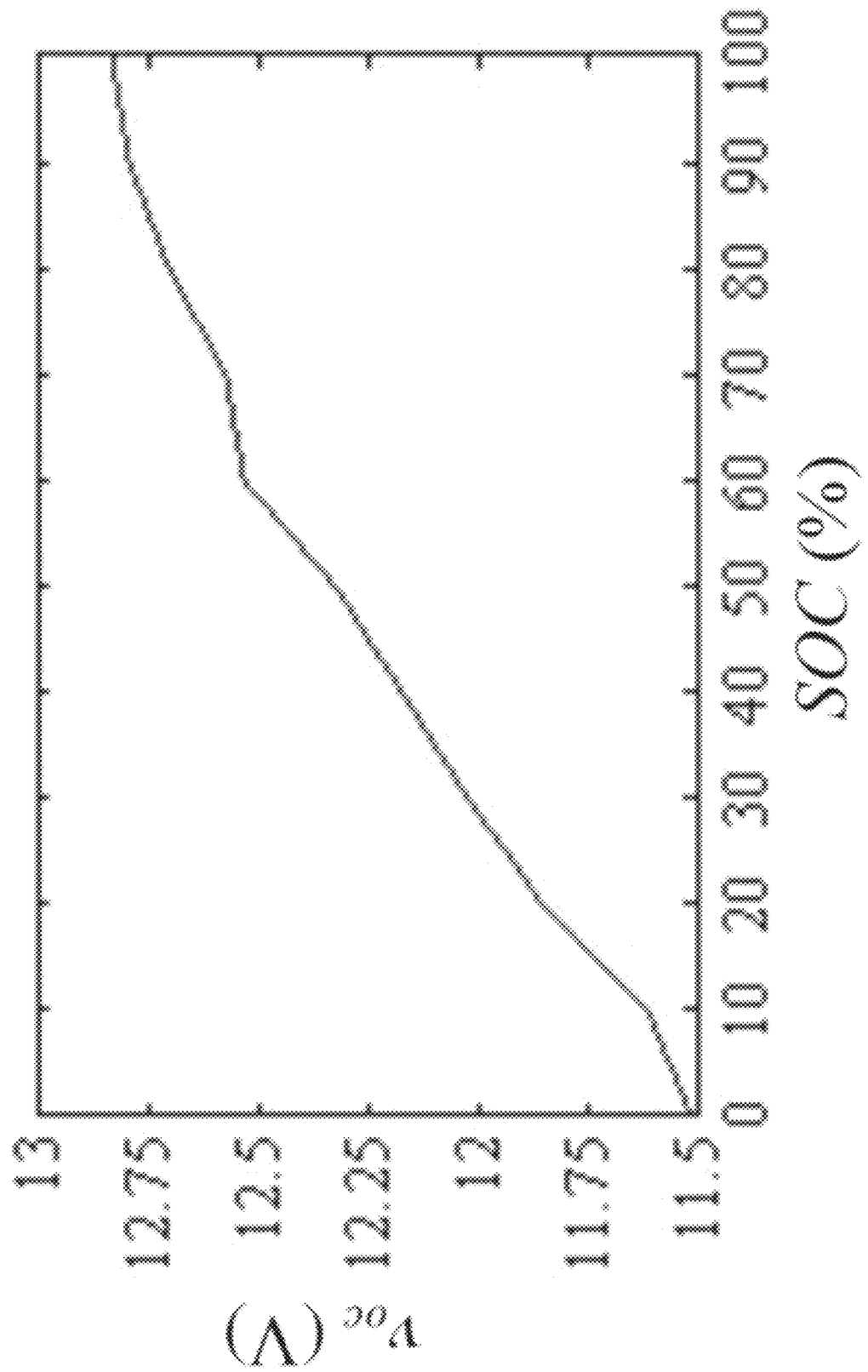
FIG. 7 is a plot showing a relationship of $v_{oc}$ against SOC of the battery under test.

With reference to FIG. 7, the battery open circuit voltage ($V_{oc}$) and SOC are in nonlinear relationships. The SOC and $V_{oc}$ relationship is stored in a lookup table.

The battery model voltage is expressed as:

$$v_b(t) = v_{oc}[SOC(t)] + i_b(t)R_o + v_1(t) + v_2(t) \tag{6}$$

where $v_{oc}[SOC(t)]$ is calculated by integrating the battery current over time with the $v_{oc}$–SOC relationship and $v_1$ and $v_2$ are the voltages across the two RC networks, respectively.

The approximate output resistor $R_{0,approx}$ is determined using the high current pulse as shown in FIG. 5 in the excitation profile as follow:

$$R_{0,approx} = \frac{1.2(v_b(1) - v_b(2))}{i_b(1) - i_b(2)} \tag{7}$$

$R_{0,approx}$ is used as the maximum value of the search boundary of $R_0$ of the m-PSO to narrowed the searching boundary.

Preferably, the method may involve processing the sampled data with a particle swarm optimization process. Particle Swarm Optimization (PSO) technique is a simple, rapid and requires less computations for dealing with this kind black-box problem. However, PSO may trap into local optima during iteration processes. To avoid this search trapping, a perturbation process is applied and modified Particle Swarm Optimization (m-PSO) is involved in the estimation of the battery diagnosis process.

The parameter set P is defined as $$P = (SOC(0), R_0, R_1, R_2, \tau_1, t_2, v_1(0), v_2(0)) \tag{8}$$

where SOC(0) is the SOC at the beginning of the excitation period, $\tau_1 = R_1 C_1$, $\tau_2 = R_2 C_2$, $v_1(0)$ and $v_2(0)$ are the initial voltages across the two RC networks.

Figure 8:
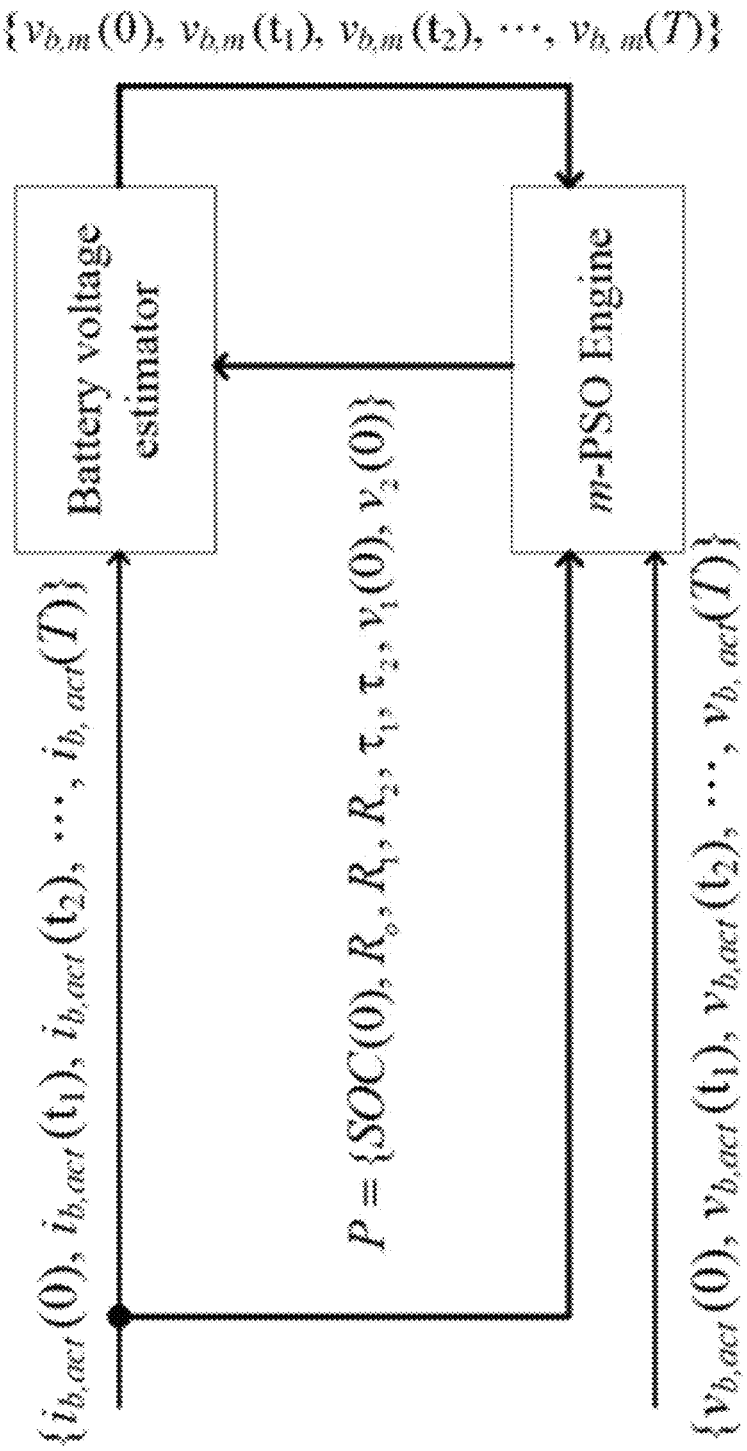
FIG. 8 is a block diagram illustrating a mechanism of determining the values of the parameters in P.

With reference to FIG. 8, the mechanism of determining the parameters in P is provided. The controller comprises an m-PSO engine which determines the parameters in P using the measured voltage-current profile and the battery model voltage produced by the battery voltage estimator of the controller which use parameters in P to calculate the battery model voltage to the m-PSO engine.

In the m-PSO engine, an objective function $\varepsilon_T$ is used to evaluate the accuracy a set of parameter. It is defined as the mean absolute error (MAE) between actual battery voltage and the battery model voltage produced by the estimated intrinsic parameters over the excitation time T by:

$$\varepsilon_T = \frac{1}{T}\int_0^T |v_{b,act}(t) - v_{b,m}[t, P, i_{b,act}(t)]| dt \tag{9}$$

where $v_{b,act}(t)$ and $i_{b,act}(t)$ are the actual battery voltage and current, respectively, at time t, $v_{b,m}[t,P,i_{b,act}(t)]$ is battery voltage calculated with the model parameter set P, and actual battery current $i_{b,act}(t)$.

The best set of parameters $P_0$ is determined by finding a set of parameter P such that the minimum MAE is obtained using m-PSO which is expressed as:

$$P_0 = \arg\min_P \varepsilon_T(P) \tag{10}$$

Figure 9:
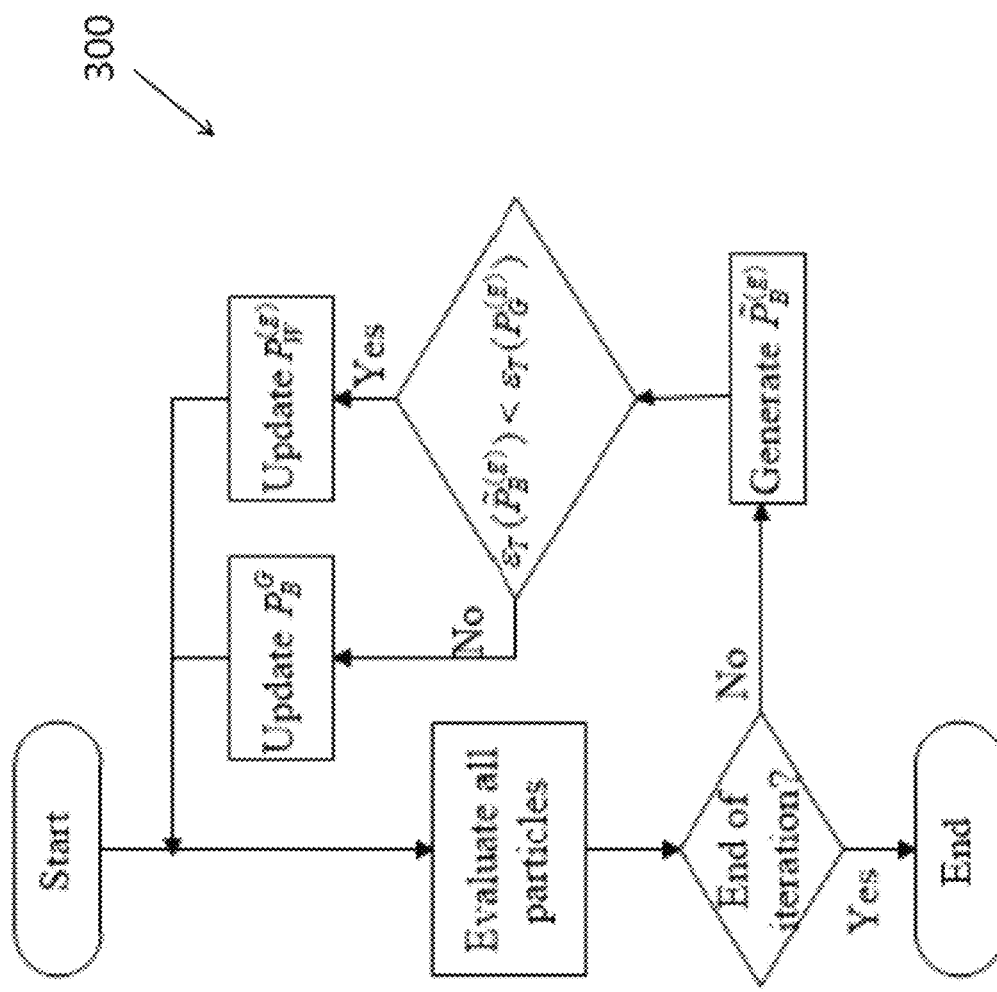
FIG. 9 is a flow diagram showing the step of processing the sampled data with an m-PSO process.

With reference to FIG. 9, there is shown an example operation of the m-PSO 900 is listed as follows:

Step 1)—N particles or parameter sets are initialized randomly. The parameters in each particle are all within their corresponding searching boundaries.

Step 2)—The MAEs of all particles are evaluated by (9).

Step 3)—A randomly-generated perturbation $\delta p^{(g)}$ is added to the globally-best particle $P_G^{(g)}$ in the current generation to generate a new particle $\tilde{P}_B^{(g)}$ which can help m-PSO escape from local minima.

$$\tilde{P}_B^{(g)} = P_G^{(g)} + \delta p^{(g)} \tag{11}$$

Step 4)—If $P_G^{(g)}$ is better than $P_G^{(g)}$, i.e. $\varepsilon_T(\tilde{P}_B^{(g)}) < \varepsilon_T(P_G^{(g)})$, a set of particles $\{P_G^{(g)} + \delta p^{(g)}, P_G^{(g)} + \delta p^{(g)}, P_G^{(g)} + 4\delta p^{(g)}, \ldots, P_G^{(g)} + 2^k \delta p^{(g)}\}$ where all particles are within the searching boundaries are evaluated. The best particles will be replaced for $\tilde{P}_B^{(g)}$. If $\tilde{P}_B^{(g)}$ is worse than $P_G^{(g)}$, the worst particle $P_w^{(g)}$ in the swarm will be replaced by $\tilde{P}_B^{(g)}$.

Step 5)—The velocities $V_i^{(g)}$ of all particles in the current generation g are calculated by:

$$V_i^{(g)} = w^{(g-1)}V_i^{(g-1)} + 2r_{1,i}^{(g-1)}[P_G - P_i^{(g-1)}] + 2r_{2,i}^{(g-1)}[P_{H,i}^{(g-1)} - P_i^{(g-1)}] \quad (12)$$

where $V_i^{(g-1)}$ is the particle velocity of the i-th particle in the previous generation, $P_G$ is the global best particle found until the current generation in the m-PSO process, $P_i^{(g-1)}$ defines the position of the $i^{th}$ particle in the previous generation, $P_i^{(g-1)}$ is defined as the individual best position of the $i^{th}$ particle up to the previous generation, $w^{(g-1)} \in (0,1)$ is the learning factor determined by the position of the particles, and $r_{1,i}^{(g-1)}$ and $r_{2,i}^{(g-1)}$ are weighting factors which are random number distribute uniformly from 0 to 1.

Step 6)—The positions of all particles are updated using the velocities of the particles $$P_i^{(g)} = P_i^{(g-1)} + V_i^{(g)} \quad (13)$$

All particles must be constrained within the search boundaries. If the velocities cause the particles go across the boundaries, the directions of the velocities are reversed such that the particles are kept inside the searching boundary.

Step 7)—Step 2) is repeated for the next generation.

The calculation of learning factor in each generation is described. The steps are listed as follows:

Step 1)—The "mean distance" $d_i$ of each particle $P_i$ to all other particles in the swarm is determined using $$d_i = \frac{1}{N-1}\sum_{j=1, i\neq j}^{N} d_{euc}(P_i, P_j) \quad (14)$$

where N is the total number of particles in the swarm and $d_{euc}(P_i P_j)$ is the normalized Euclidian distance between any two particles $P_i$ and $P_j$ $$d_{euc}(P_i, P_j) = \sqrt{\sum_{k=1}^{D}\left(\frac{P_{i,k} - P_{j,k}}{U_k - L_k}\right)^2} \quad (15)$$

where D is the dimension of the particles, $P_{i,k}$ is the k-th scalar of $P_i$, $U_k$ and $L_k$ are the maximum and minimum value of the searching boundary of the k-th dimension.

Step 2)—$d_g$ is defined as "mean distance" of the global best particle $P_G^{(g)}$ to all other particles in the swarm which is determined with (14). $d_{max}$ and $d_{min}$ are defined as the maximum and minimum "mean distance" of all particles in the swarm. The "evolutionary factor" f is determined using $$f = \frac{d_g - d_{min}}{d_{max} - d_{min}} \in [0, 1] \quad (16)$$

Step 3)—The learning factor is found by mapping f using a sigmoid function:

$$w(f) = \frac{1}{1 + 1.5e^{-2.6f}} \quad (17)$$

Figure 10:
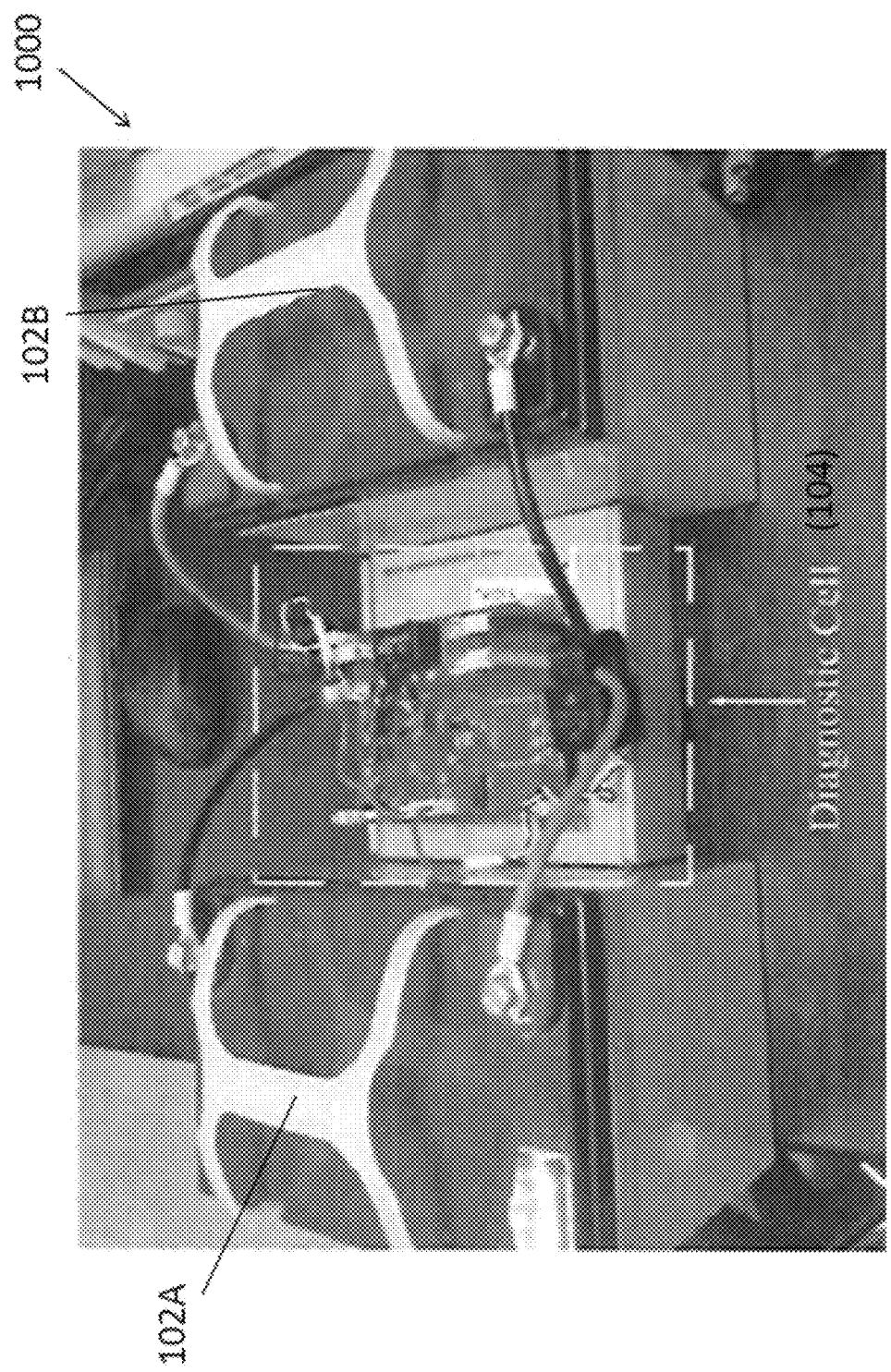
FIG. 10 is a photographic image showing an experimental setup of an electrical energy storage apparatus in accordance with one embodiment of the present invention.

With reference to FIG. 10, there is provided an embodiment of a diagnostic cell 1000 for diagnosing two 12V, 33Ah lead-acid batteries RA 12-33 from RITAR has been built and evaluated. The diagnostic device 104 consists of microcontroller, voltage and current conditioning unit. A computer was connected to the diagnostic cell to record the estimated intrinsic parameters of the batteries 102.

In this experiment, a current excitation was generated for a period of time to each battery to estimate the intrinsic parameter using m-PSO. The voltage and current were measured. The buck-boost converter was operated at a fixed switching frequency. Another 10-second current excitation is then generated to each battery 102. The battery voltage was estimated using the previously estimated intrinsic parameters.

The estimated voltage was compared with the measured battery voltage to verify the accuracy of the method.

The time for estimating the intrinsic parameters for each battery took about 100 s. The estimated intrinsic parameters are shown in the following Table. The internal resistance of the two batteries were also found using the IEC 60896-21 testing method with NHR 9210 battery testing system. The difference between the $R_o$ estimated by m-PSO and the one found using IEC 60896-21 testing method is less than 4.6%.

| Parameter | Estimated result using m-PSO | | Result using IEC 60896-21 testing method | |
|---|---|---|---|---|
| | Battery 1 | Battery 2 | Battery 1 | Battery 2 |
| $R_o$ | 14.6 mΩ | 14.5 mΩ | 14.9 mΩ | 15.2 mΩ |

Figure 11A:
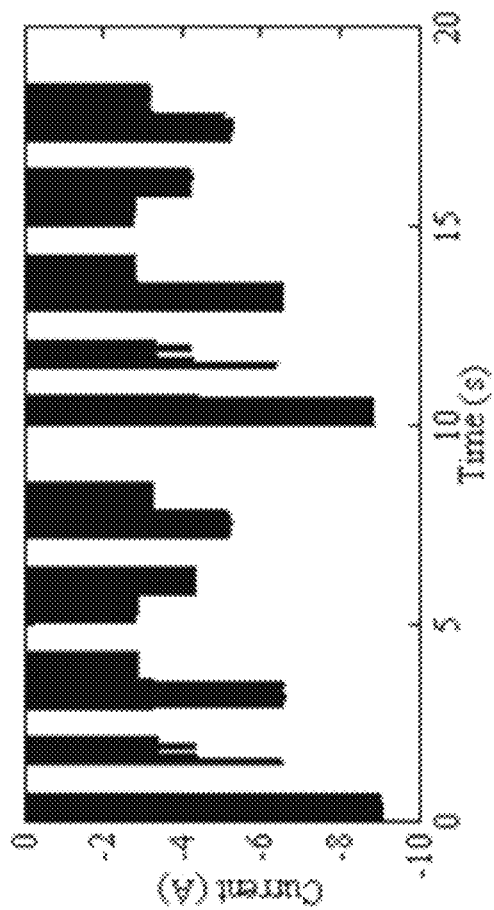
FIGS. 11A and 11B are plots showing a current profile, a voltage profile and a prediction error of the measurement results of battery 1.
Figure 11B:
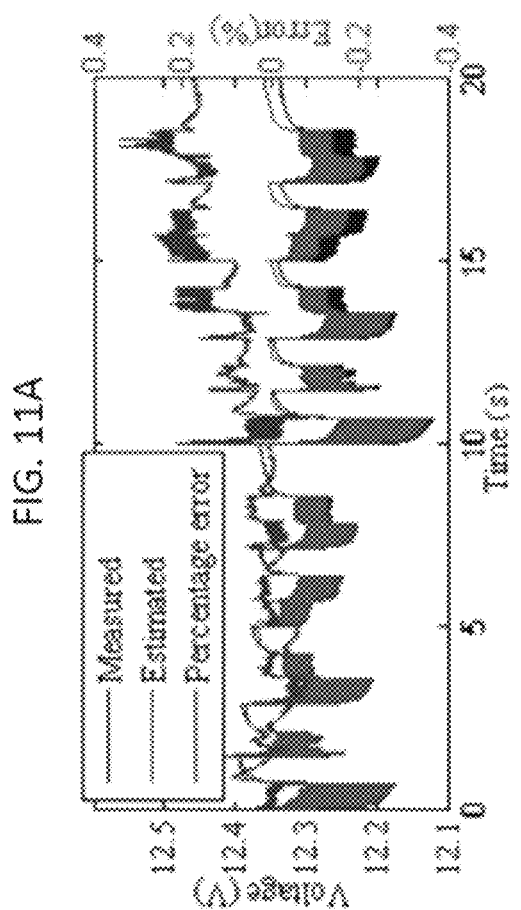

The measured current and voltage of the two batteries are shown in FIGS. 11 and 12 respectively. The measured battery voltage and estimated battery model voltage is compared to validate the estimated intrinsic parameters. The percentage error between the measured voltage and the estimated voltage is less than 0.5%.

These embodiments may be advantageous in that a battery diagnostic cell may be used for determining the SOC and SOH of the two series-connected battery units in any battery assembly or energy storage system. Such cell can be applied to large-scale battery banks. The method is based on using a buck-boost converter to control the transfer of energy to and from two batteries.

Advantageously, by sensing the battery voltage and battery current waveforms, the intrinsic parameters of the batteries are estimated, therefore health status of individual battery cells in a battery assembly may be evaluated. Such information may be useful for system engineers or operators in the maintenance of various electrical devices. A modified PSO estimation method is used to estimate the intrinsic parameters of the two batteries. The testing process is entirely environmentally-friendly.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

The invention claimed is:

1. A method of diagnosing an electrical energy storage apparatus, comprising the steps of:
    exciting at least one energy storage system in the electrical energy storage apparatus, wherein the at least one energy storage system includes a first energy storage component and a second energy storage component;

sampling data associated with an electrical characteristic of the at least one energy storage system in response to the excitation of the at least one energy storage system; and estimating at least one electrical parameter and/or at least one operational condition attribute of the at least one energy storage system;

wherein the step of exciting at least one energy storage system includes facilitating transferring energy stored in the first energy storage component to the second energy storage component.

2. The method of diagnosing an electrical energy storage apparatus in accordance with claim 1, wherein the first energy storage component and the second energy storage component are connected in series.

3. The method of diagnosing an electrical energy storage apparatus in accordance with claim 1, wherein the step of exciting at least one energy storage system further includes facilitating transferring energy stored in the second energy storage component to the first energy storage component.

4. The method of diagnosing an electrical energy storage apparatus in accordance with claim 1, wherein the step of exciting at least one energy storage system further includes facilitating recycling transferred energy from the second energy storage component to the first energy storage component.

5. The method of diagnosing an electrical energy storage apparatus in accordance with claim 1, wherein the step of exciting at least one energy storage system includes manipulating individual switches in a switching-network to facilitate the energy transfer between the first energy storage component and the second energy storage component.

6. The method of diagnosing an electrical energy storage apparatus in accordance with claim 1, wherein the electrical characteristic includes at least a current profile and a voltage profile associated with the at least one energy storage system under the excitation.

7. The method of diagnosing an electrical energy storage apparatus in accordance with claim 1, wherein the electrical characteristic includes a plurality of intrinsic parameters of the first energy storage component and/or the second energy storage component.

8. The method of diagnosing an electrical energy storage apparatus in accordance with claim 1, wherein the electrical parameter includes an internal resistance of the first energy storage component and/or the second energy storage component.

9. The method of diagnosing an electrical energy storage apparatus in accordance with claim 1, wherein the electrical parameter further includes a state of charge and/or a state of health of the first energy storage component and/or the second energy storage component.

10. The method of diagnosing an electrical energy storage apparatus in accordance with claim 1, wherein the step of estimating the at least one electrical parameter of the at least one energy storage system includes processing the sampled data with a particle swarm optimization process.

11. The method of diagnosing an electrical energy storage apparatus in accordance with claim 1, wherein the step of estimating the at least one electrical parameter is based on an equivalent model of the at least one energy storage system, wherein the equivalent model is composed of a voltage source, an output resistor and at least one resistor-capacitor network.

12. The method of diagnosing an electrical energy storage apparatus in accordance with claim 11, wherein a state of charge of the first energy storage component or the second energy storage component is found by the relationship of state of charge and open circuit voltage of the first energy storage component or the second energy storage component respectively.

13. The method of diagnosing an electrical energy storage apparatus in accordance with claim 11, wherein the state of health of the first energy storage component and/or the second energy storage component is indicated by the output resistor of the equivalent circuit model.

14. The method of diagnosing an electrical energy storage apparatus in accordance with claim 10, wherein the step of processing the sampled data with the particle swarm optimization process involve a perturbation process.

\* \* \* \* \*